United States Patent
Lin et al.

(10) Patent No.: US 8,741,726 B2
(45) Date of Patent: Jun. 3, 2014

(54) REACTED LAYER FOR IMPROVING THICKNESS UNIFORMITY OF STRAINED STRUCTURES

(75) Inventors: Cheng-Te Lin, Taipei (TW); Chih-Lin Wang, Zhubei (TW); Yi-Huang Wu, Zhubei (TW); Tzong-Sheng Chang, Chubei (TW)

(73) Assignee: Taiwan Semiconductor Manufacturing Company, Ltd. (JP)

( * ) Notice: Subject to any disclaimer, the term of this patent is extended or adjusted under 35 U.S.C. 154(b) by 53 days.

(21) Appl. No.: 13/308,928

(22) Filed: Dec. 1, 2011

(65) Prior Publication Data

US 2013/0143391 A1 Jun. 6, 2013

(51) Int. Cl.
*H01L 21/331* (2006.01)

(52) U.S. Cl.
USPC .............. 438/360; 257/E21.43; 257/E21.431; 257/E21.433; 438/300; 438/303; 438/478; 438/938

(58) Field of Classification Search
USPC ............... 257/E21.43, E21.431, E21.433; 438/300, 303, 360, 478, 938
See application file for complete search history.

(56) References Cited

U.S. PATENT DOCUMENTS

| | | | |
|---|---|---|---|
| 6,448,139 B2 * | 9/2002 | Ito et al. | 438/270 |
| 2009/0289379 A1 * | 11/2009 | Han et al. | 257/E21.431 |
| 2010/0240227 A1 * | 9/2010 | Gluschenkov et al. | 438/799 |

OTHER PUBLICATIONS

Lai et al., "Growth Characterization of Rapid Thermal Oxides", J. Vac. Sci. Technology. B, vol. 17(5), p. 2226-2238 (1999).*

* cited by examiner

*Primary Examiner* — Asok K Sarkar
(74) *Attorney, Agent, or Firm* — Lowe Hauptman & Ham, LLP

(57) ABSTRACT

Methods are disclosed of forming and removing a reacted layer on a surface of a recess to provide mechanisms for improving thickness uniformity of a semiconductor material formed in the recess. The improved thickness uniformity in turn improves the uniformity of device performance.

20 Claims, 12 Drawing Sheets

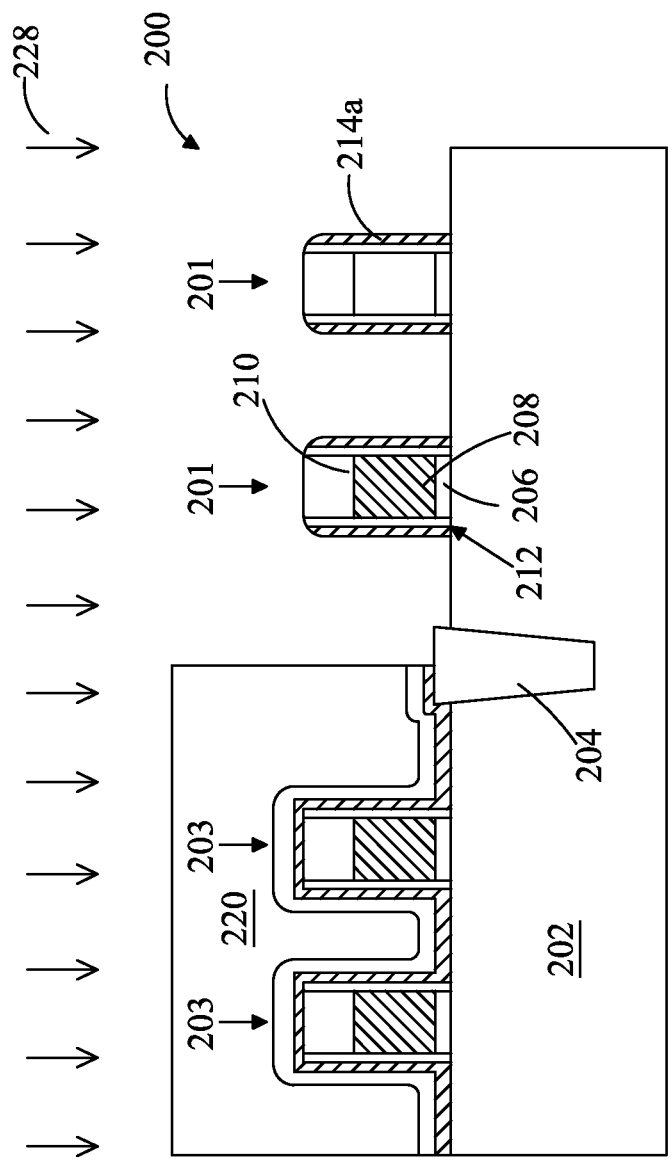

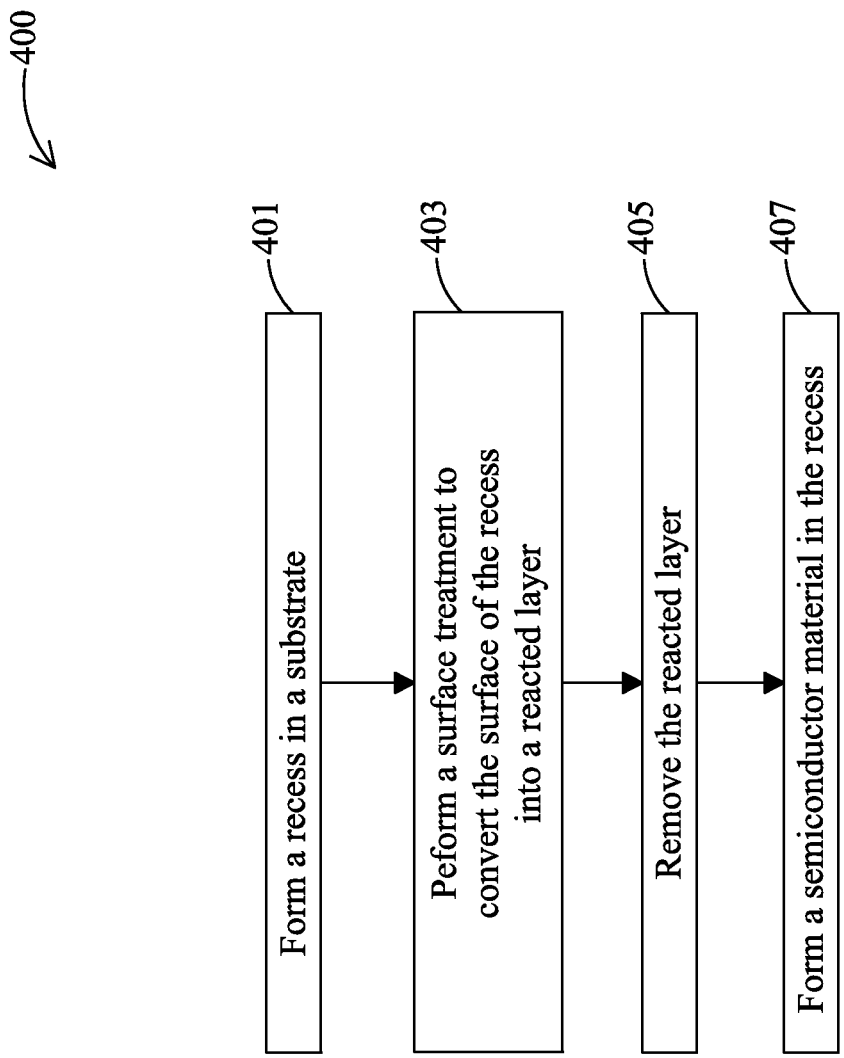

REACTED LAYER FOR IMPROVING THICKNESS UNIFORMITY OF STRAINED STRUCTURES

RELATED APPLICATIONS

The present application is related U.S. application Ser. No. 12/571,604, entitled "Strained Structure of Semiconductor Devices," filed on Oct. 1, 2009, which is incorporated herein by reference in its entirety.

FIELD

This application relates to forming a semiconductor material layer in a recess region on a substrate and, more particularly, to forming epitaxial silicon germanium (SiGe) in a recess region.

BACKGROUND

When a semiconductor device, such as a metal-oxide-semiconductor field-effect transistor (MOSFET), is scaled down through various technology nodes, high k dielectric material and metal are adopted to form a gate stack. In addition, strained structures utilizing epitaxial silicon germanium (SiGe) may be used to enhance carrier mobility. However, current techniques to form these strained structures have not been satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A-2G are cross-sectional views of an embodiment of a semiconductor device at various stages of fabrication according to the method of FIG. 1, in accordance with some embodiments.

FIG. 4 shows a process flow of forming epitaxial SiGe, in accordance with some embodiments.

DETAILED DESCRIPTION

Figure 1:
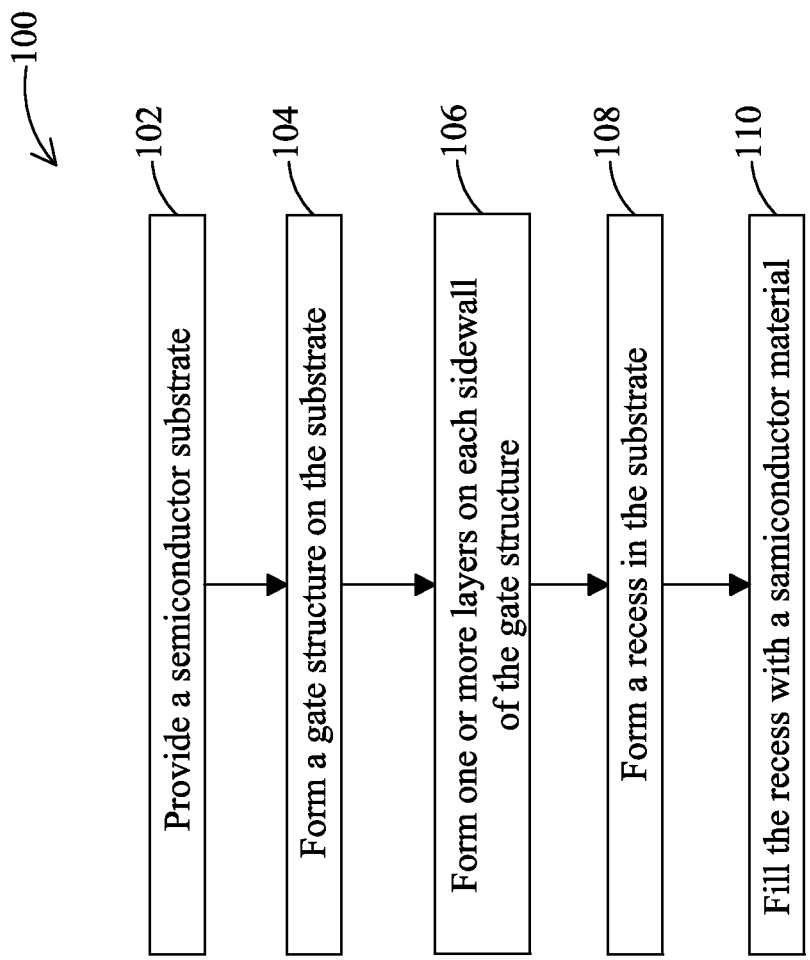
FIG. 1 is a flow chart of a method of fabricating a semiconductor device having strained features, in accordance with some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Strained source and drain regions compress the channel region, which leads to an increase in mobility of charge carriers through the channel. An exemplary method of forming strained source and drain regions involves forming an epitaxial SiGe (silicon germanium) layer in the source and drain regions. This is because the larger molecular size of germanium, compared to silicon, creates strain in the epitaxial SiGe layer.

FIG. 1 illustrates a flow chart of a method 100 of fabricating a semiconductor device, in accordance with some embodiments. Method 100 begins with block 102 in which a semiconductor substrate is provided. Method 100 continues with block 104 in which a gate structure is formed on the substrate. Afterwards, the method 100 proceeds to block 106 in which one or more layers are formed on each sidewall of the gate structure. Method 100 then continues with block 108 in which a recess is formed in the substrate. Method 100 then continues with block 110 in which the recess is filled with a semiconductor material. The discussion that follows illustrates various embodiments of a semiconductor device that can be fabricated according to the method 100 of FIG. 1.

Figure 2A:
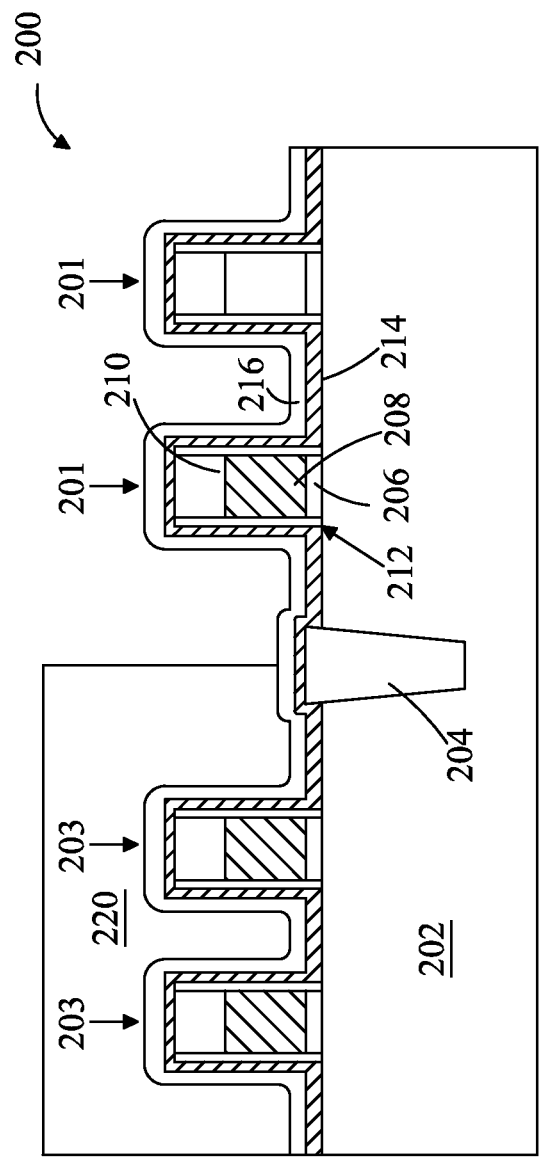

FIGS. 2A-2G illustrate a semiconductor device 200 at various stages of fabrication according to the method 100 of FIG. 1, in accordance with some embodiments. It is understood that FIGS. 2A-2G have been simplified for the sake of clarity to better understand the inventive concepts of the present disclosure. FIG. 2A shows that the semiconductor device 200 includes a substrate 202. The substrate 202 includes a silicon substrate. In another embodiment, the semiconductor substrate 202 may include an epitaxial layer. For example, the substrate 202 may have an epitaxial layer overlying a bulk semiconductor. The substrate 202 further includes doped regions such as p-wells and n-wells. Furthermore, the substrate 202 may include a semiconductor-on-insulator (SOI) structure such as a buried dielectric layer. Alternatively, the substrate 202 may include a buried dielectric layer such as a buried oxide (BOX) layer, such as that formed by a method referred to as separation by implantation of oxygen (SIMOX) technology, wafer bonding, selective epitaxial growth (SEG), or other suitable method. The semiconductor device 200 includes active regions defined in the substrate 202.

Various shallow trench isolation (STI) structures 204 are formed in the semiconductor substrate for isolating the various active regions. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

One or more operational devices are formed in the active regions. The operational devices include n-type and p-type metal-oxide-semiconductor (NMOS and PMOS) field-effect transistors. The operational devices are configured as an array of NMOS devices and an array of PMOS devices. The NMOS and PMOS devices may be fabricated by CMOS technology processing. Accordingly, it is understood that additional processes may be provided before, during, and after the method 100 of FIG. 1, and that some other processes may only be briefly described herein. Each NMOS and PMOS device includes a gate structure, such as structures 201 and 203, formed on the semiconductor substrate 202. Each gate structure includes a gate dielectric 206 and a gate electrode 208. The gate dielectric 206 may include silicon oxide, silicon nitride, a high-k dielectric, or other suitable materials. The high-k dielectric layer may include a binary or ternary high-k film such as $HfO_x$. Alternatively, the high-k dielectric layer 206 may optionally include other high-k dielectrics such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides, or other suitable materials. The gate dielectric is formed by a suitable process such as an atomic layer deposition (ALD), chemical vapor deposition (CVD), physical vapor deposition (PVD), thermal oxidation, UV-ozone oxidation, or combinations thereof.

Each gate structure may include the gate electrode 208. In some embodiments, the gate electrode 208 is made of polysilicon (or poly). For example, silane ($SiH_4$) may be used as a chemical gas in a CVD process to form the poly. The poly layer may include a thickness ranging from about 400 to about 800 Angstroms (Å). The gate structure may further include a hard mask layer 210 formed on the gate electrode 208. The hard mask layer 210 may be made of silicon oxide. Alternatively, the hard mask layer 210 may be made of or include silicon nitride, silicon oxynitride, and/or other suitable dielectric materials, and may be formed using a method such as CVD or PVD. The hard mask layer 210 may include a thickness ranging from about 100 to about 400 Angstroms (Å).

The semiconductor device 200 may include an offset spacer 212 formed on each sidewall of the gate structures. The offset spacer 212 is made of silicon nitride and has a thickness ranging from about 4 to about 6 nm, in accordance with some embodiments. The offset spacer 212 may be formed by CVD, PVD, ALD, plasma enhanced CVD (PECVD), or other suitable techniques. An ion implantation process may be performed to form lightly doped source/drain (LDD) regions (not shown) in the substrate 202. The LDD regions are aligned with the offset spacer 212. The ion implantation process may utilize p-type dopants (e.g., B or In) for the PMOS devices and n-type dopants (P or As) for the NMOS devices.

The semiconductor device 200 further includes an oxide layer 214 formed over the substrate 202 and the gate structures. The oxide layer may be formed by CVD, PVD, ALD, or other suitable techniques. The oxide layer 214 has a thickness ranging from about 2 to about 4 nm, in some embodiments. The semiconductor device 200 further includes a capping layer 216 formed over the oxide layer 214. The capping layer 216 is formed of silicon nitride, in some embodiments. The capping layer 216 may be formed by CVD, PVD, ALD, or other suitable technique. The capping layer 216 has a thickness ranging from about 10 to about 15 nm, in some embodiments. It should be noted that the pad oxide layer 214 may be omitted in some embodiments.

A patterned photoresist layer 220 is formed to protect the NMOS devices. The patterned photoresist layer 220 may be formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper techniques such as maskless photolithography, electron-beam writing, ion-beam writing, and molecular imprinting.

Figure 2B:
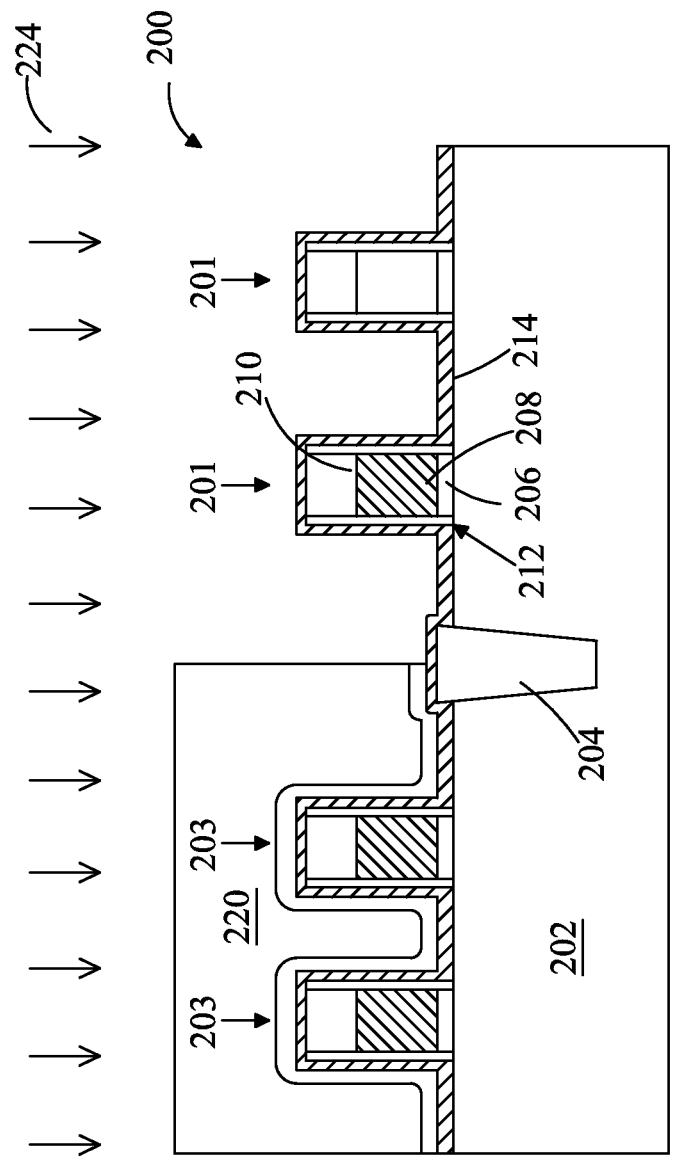

In FIG. 2B, an etching process 224 is performed to remove the capping layer 216 overlying the PMOS devices. A dry plasma etching process may be used to remove the capping layer 216, in some embodiments. In some embodiments, the etching process utilizes a gas or gas mixture including at least a fluorine-containing gas. In some other embodiments, the etching process 224 may optionally include a wet etching that has a high selectively of silicon nitride to silicon oxide.

In FIG. 2C, an etching process 228 is performed to remove oxide layer 214 directly overlying substrate 202. The etching process 228 may be a dry plasma etching process that utilizes a gas combination of $CF_4/Cl_2/HBr/He$. The dry etching removes portions of the oxide layer 214 overlying the substrate 202. The dry etching may be performed to break through oxide layer 214. However, this time period may be insufficient to remove the pad oxide disposed on the offset spacer 212. Therefore, following the etching process 228, an oxide layer 214a remains on the sidewalls of PMOS gate structures. The offset spacer 212 and the oxide layer 214a together act as dummy spacers for the gate structures.

As previously noted, in some other embodiments, the oxide layer 214 may be omitted. Accordingly, the capping layer 216 is formed on the offset spacer. A dry plasma etching may be performed to anisotropically etch the capping layer 216 such that a portion of the capping layer 216 directly overlying the substrate is removed but another portion of the capping layer 216 remains on the offset spacer. The dry etching may be tuned such that the resulting dummy spacers (e.g., capping layer 216 and offset spacer 212) have a similar thickness when utilizing the oxide layer 214. In other embodiments, the resulting dummy spacers may be thinner so that the opening can be formed closer to the channel region. In some embodiments, the dummy spacers include both the capping layer and the oxide layer.

Figure 2D:
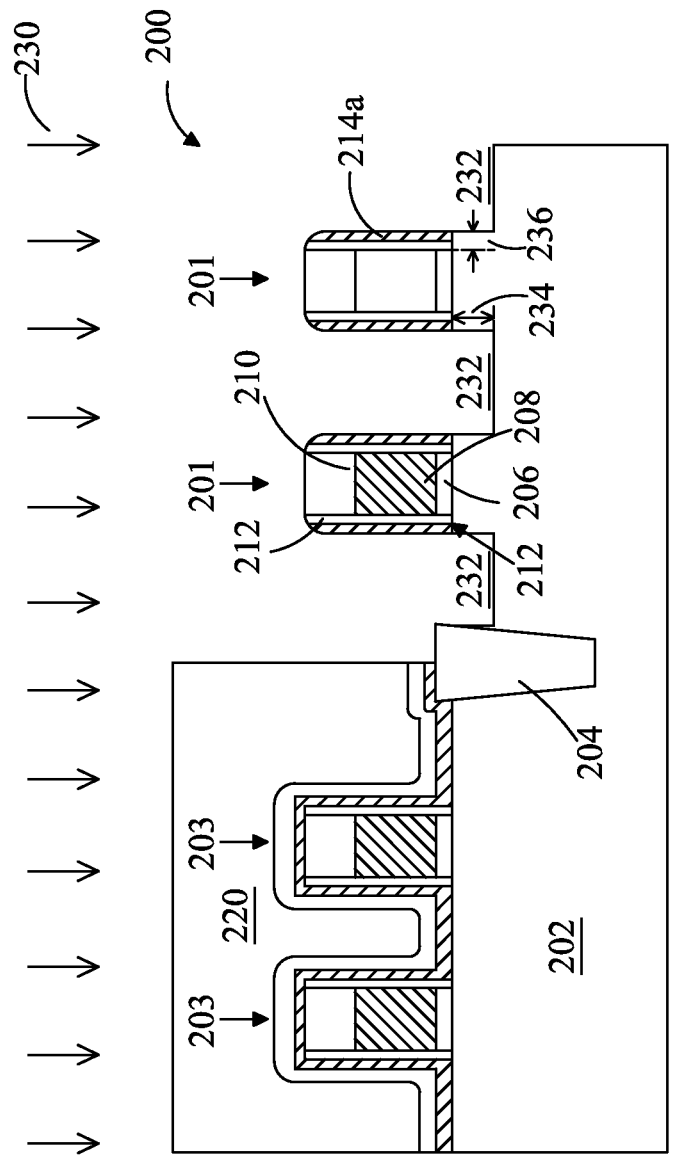

In FIG. 2D, an etching process 230 is performed to etch a recess or opening 232 in the substrate 202. In some embodiments, the etching process 230 may include a dry etching process that utilizes a combination of $HBr/Cl_2/O_2/He$. The dry etching removes portions of the silicon substrate that are unprotected or exposed. It is noted that the oxide 214a and hard mask 210 protect the gate structure of the PMOS device during the dry etching process. The dry etching process allows better control of an etching direction to achieve of a particular shape. Accordingly, the recess 232 has substantially vertical sidewalls that are aligned with the oxide 214a due to the directional/anisotropic etching. The recess 232 may have a depth 234. In some embodiments, depth 234 is in a range from about 100 Å to about 250 Å.

A proximity of the recess 232 to a channel region 238 may be limited by the thickness of the offset spacer 212 and oxide 214 disposed on the sidewall of the gate structure (or 214a). In some embodiments, a proximity of the subsequently formed strained feature can be reduce by performing a dilute HF wet etching to remove the pad oxide before etching the recess. In some embodiments, the recess 232 is spaced a distance 236 of about 4 to about 5 nm from the channel region.

Figure 2E:
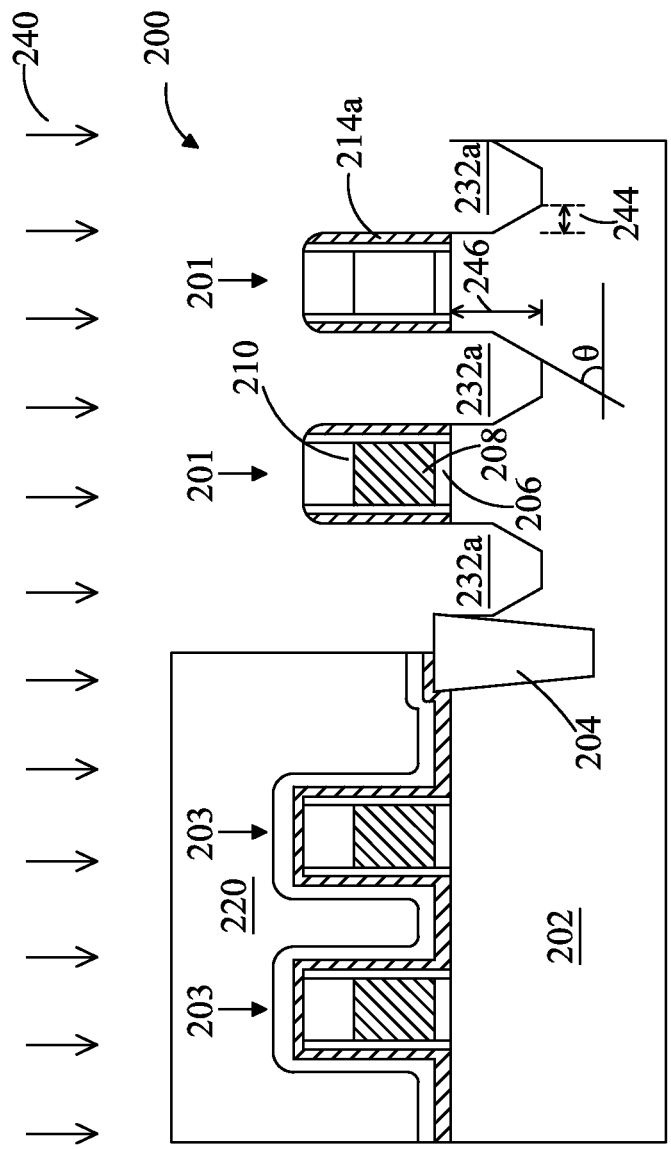

In FIG. 2E, another etching process 240 is performed to modify the recess 232 in the substrate, in accordance with some embodiments. The etching process 240 may include a dry etching process that utilizes a combination of $HBr/O_2/He$. The dry etching process may be tuned so that the sidewalls of the recess are tapered, as shown in FIG. 2E. In some embodiments, a bias voltage may be tuned to achieve the tapered sidewalls. The recess 232a may include tapered sidewalls that have a tapered angle θ. In some embodiments, the tapered angle θ is in a range from about 50° to about 70°. It is noted that the angle θ is measured with respect to an axis that is parallel to the surface of the substrate 202. In some embodiments, the tapered portion of the recess 232a tapers at a distance 244. In some embodiments, distance 244 is about 4 nm from the vertical side of the recess. The recess 232a may have an overall depth 246 ranging from about 500 Å to about 600 Å.

Figure 2F:
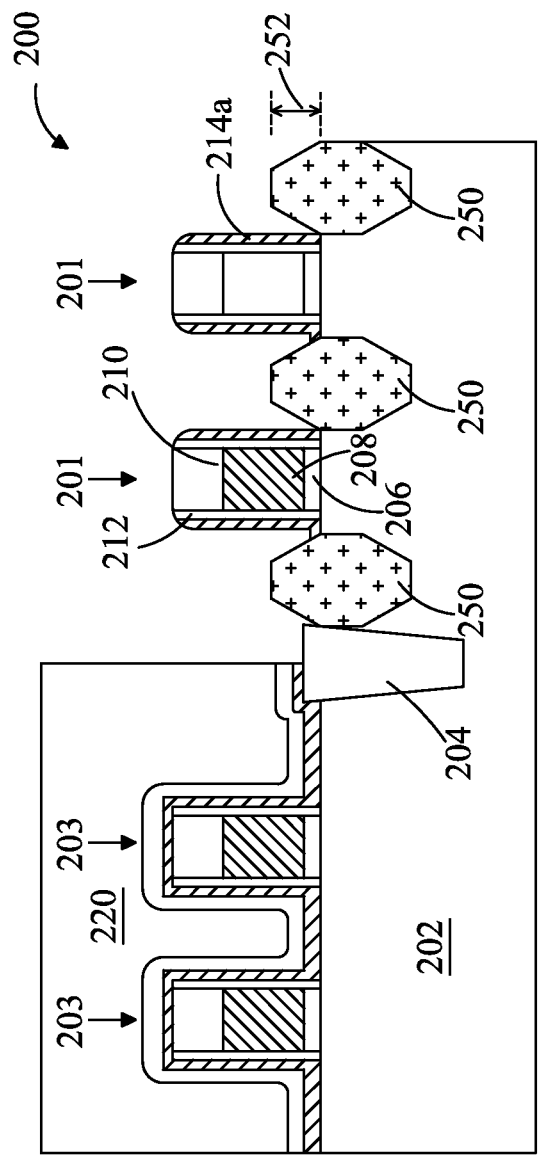
Figure 2G:
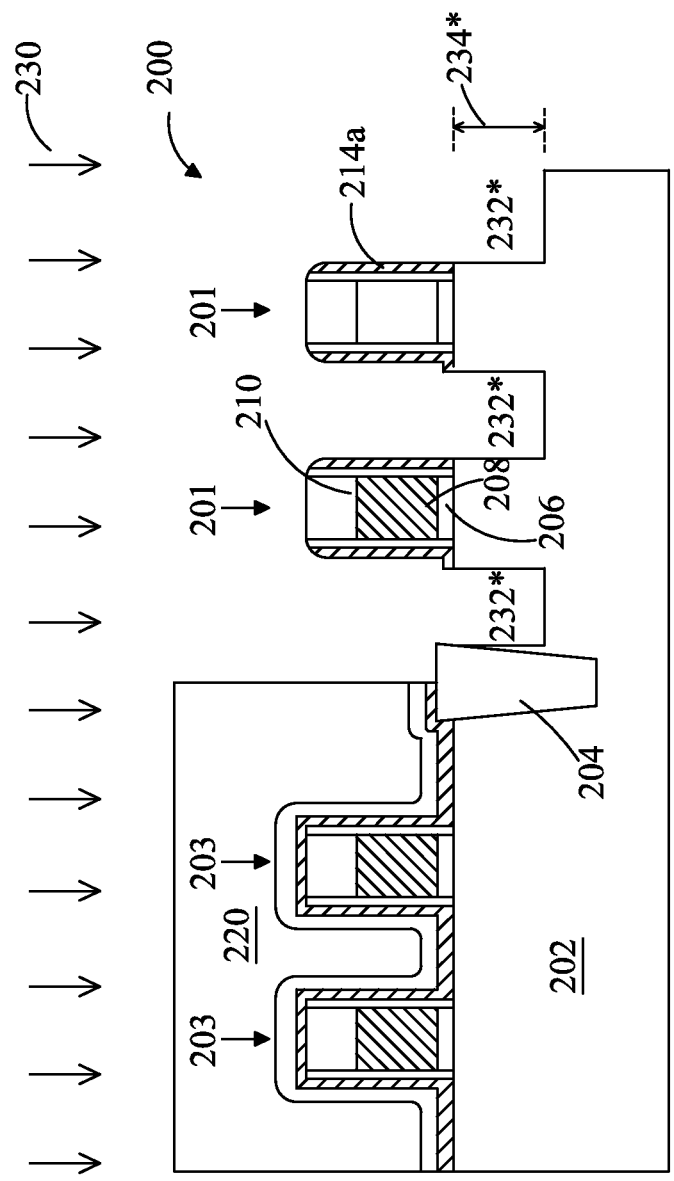

In FIG. 2F, an epitaxial (epi) process is performed to deposit a semiconductor material in the recess 232a. The semiconductor material is different from the substrate. Accordingly, the channel region is strained or stressed to enable carrier mobility of the device and enhance the device performance. The patterned photoresist 220 protecting the NMOS devices is removed prior to the epi process. A pre-cleaning process may be performed to clean the recess 232a with HF or other suitable solution. In some embodiments, the pre-cleaning process uses a diluted HF solution with an HF concentration in a range from about 0.1% to about 2% at a room temperature, such as in a range from about 20° C. to about 27° C. In the present embodiment, silicon germanium (SiGe) 250 is deposited by an epitaxial (epi) process on the substrate 202 to form the source and drain regions. It is noted that the SiGe 250 does not accumulate on the hard mask 210, the oxide 214a, the capping layer 216, and the isolation structure 204. In some embodiments, the SiGe 250 is deposited such that it is raised a distance 252 above the surface of the substrate 202. The distance 252 may be in a range of about several hundred Å, such as between about 100 Å to about 150 Å. In furtherance of the present embodiment, the SiGe 250 may be in-situ doped with p-type impurities, such as B or In, to form source/drain regions of the PMOS devices.

The recess 232a formed in FIG. 2E is merely an example. Other shapes of recess may also be formed. For example, the recess may have a substantially vertical wall, such as the walls of recess 232* shown in FIG. 2G, in accordance with some embodiments. The depth 234* is deeper than depth 234 shown in FIG. 2D. The deeper 234* may be achieved by longer etching time. Such recess does not have tapered sidewalls. A semiconductor material, such as epitaxial SiGe, may also be formed in the recess 234*. Additional details of forming the structures shown in FIGS. 2A-2G and other embodiments of forming a semiconductor material in a recess can be found in U.S. application Ser. No. 12/571,604, entitled "Strained Structure of Semiconductor Devices," filed on Oct. 1, 2009, which is incorporated herein by reference in its entirety.

The formation of the SiGe 250 structure in closer proximity to the channel region near the surface of the substrate provides more stress and strain, and thus carrier mobility is enhanced. Accordingly, a saturation drain current of the device can be improved by 10 to 20% over current techniques that form the strained structures. Further, the etching processes discussed above allow a better process margin to control the proximity of the SiGe 250 structure from the channel region. Additionally, the SiGe 250 structure does not suffer from short channel penalty such as drain induced barrier lowering (DIBL) due to SiGe proximity pull back (from the region of the substrate directly under the gate structure) with respect to the vertical and tapered sidewalls of the SiGe structure. This is even so as device features shrink and the channel length becomes smaller in advanced technology processes (e.g., 32 nm and below).

Figure 3A:
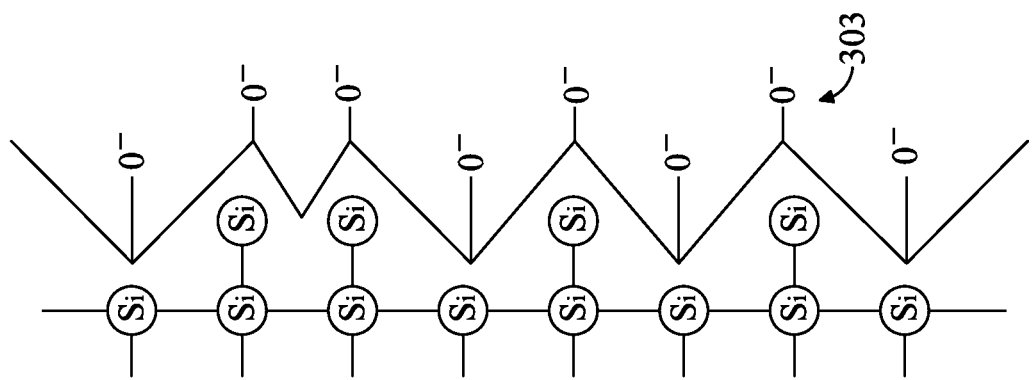
FIG. 3A shows a silicon recess region and etched silicon surface, in accordance with some embodiments.
Figure 3A:
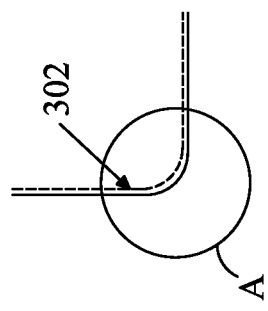
Figure 3A:
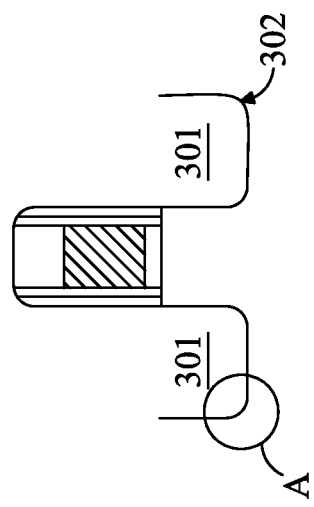
Figure 3B:
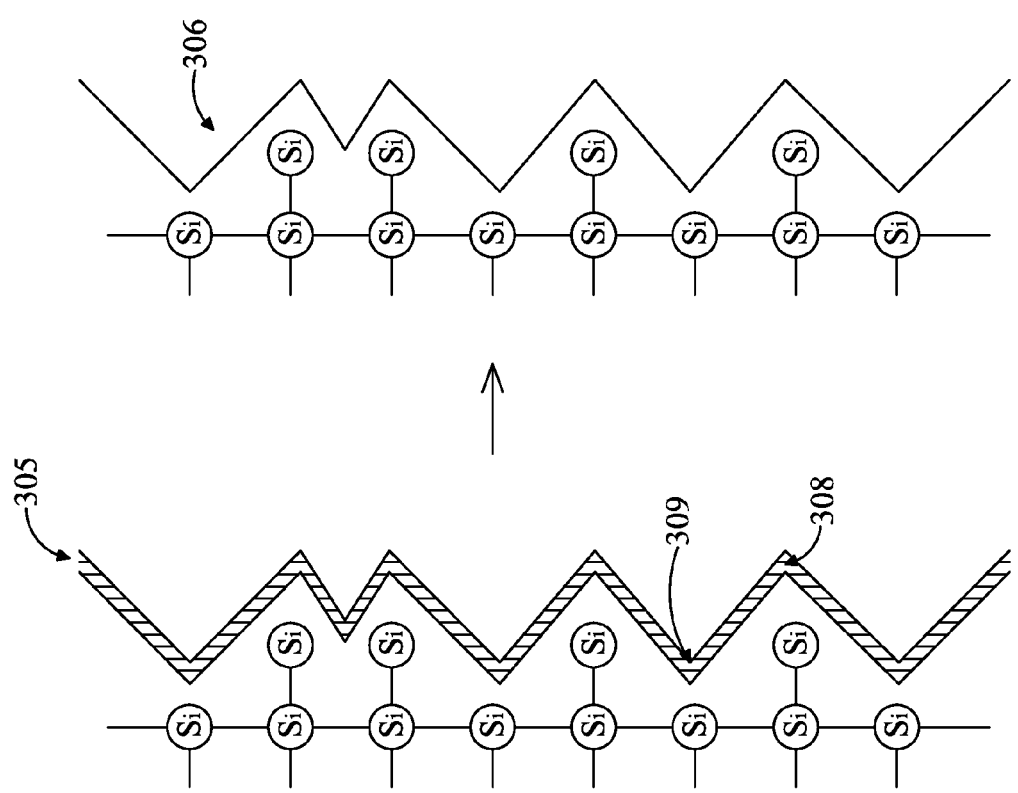
FIG. 3B shows an uneven oxide layer of the silicon surface, in accordance with some embodiments.

However, during recess formation, the silicon surface is roughened and becomes uneven. In addition, the etching plasma, using gas mixtures such as $HBr/Cl_2/O_2/He$, $HBr/O_2/He$, or other silicon-etching plasma, oxidizes the etched surface. FIG. 3A shows a silicon recess regions 301 and the etched silicon surface 302, in accordance with some embodiments. A region "A" of etched silicon surface 302 is shown in FIG. 3A. FIG. 3A also shows a schematic diagram of the oxidized silicon surface with dangling oxygen bonds 303 on the silicon surface. As mentioned above, a pre-clean process using an oxide removing chemistry, such as diluted HF, is often used to remove the surface oxide before the formation of SiGe 250. FIG. 3B shows that the silicon surface has an uneven oxide layer 305, in accordance with some embodiments. After the pre-clean process, the uneven oxide layer is removed and leaves an uneven silicon surface 306. The uneven silicon surface makes the control of the formation of SiGe 250 difficult. As a result, the thickness variation of SiGe 250 is large, which could lead to wider variation in PMOS device performance. For example, the thickness variation (3 sigma) of SiGe 250 could be as high as about 40 Å and the variation of PMOS saturation current (Idsat) could be about 15%, which are unacceptable. Such large SiGe 250 thickness and PMOS device performance variations are not acceptable for advanced technologies, such as 28 nm technology and below. Therefore, mechanisms for improving the thickness and device performance variations need to be identified.

Figure 3C:
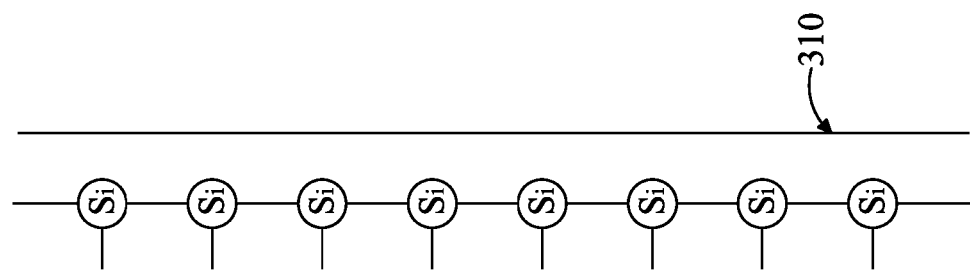
FIG. 3C shows a surface treatment or reaction performed to convert a roughened surface layer into a thicker reacted layer, in accordance with some embodiments.
Figure 3C:
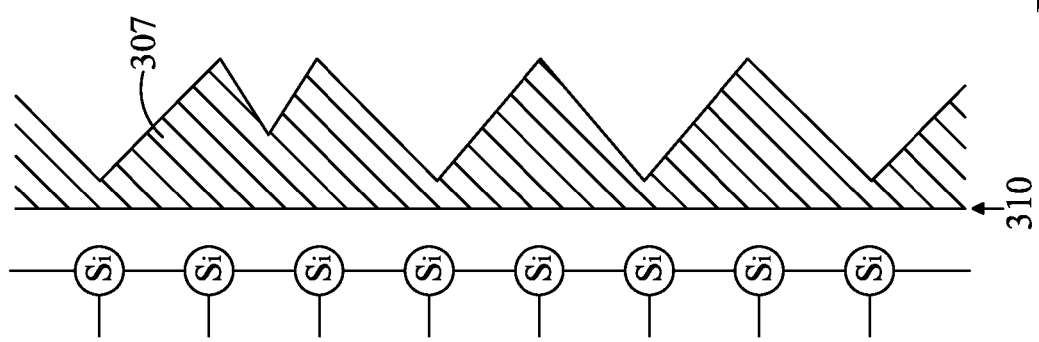

FIG. 3C shows a surface treatment or reaction can be performed to convert the roughened surface layer 305 into a thicker reacted layer 307, in accordance with some embodiments. For example, an oxidation, such as a high temperature anneal in an oxygen-containing environment, can be performed on the surface layer 305 to convert the roughened silicon surface under the surface layer 305 into a thicker oxide layer 307. In some embodiments, the oxidation performed is a rapid thermal processing (RTP) anneal at a temperature equal to or greater than 925° C. using an oxygen-containing gas, such as $O_2$. The RTP anneal can also include an inert carrier gas, such as He and/or Ar. Alternatively, the oxygen-containing gas may include steam or $N_2O$.

The protruding silicon surface (or silicon surface at location 308 of FIG. 3B) tends to be more reactive to oxygen-species in the environment than the recessed silicon surface (or silicon surface at location 309 of FIG. 3B). FIG. 3C shows that the reacted layer 307 is thicker at protruding locations and thinner at recessed locations, which makes the un-reacted silicon surface 310 smoother and more even. After the reaction is completed, the reacted layer 307 is removed by a cleaning process to expose the un-reacted silicon surface 310. In some embodiments, the cleaning process utilizes a diluted HF solution with an HF concentration in a range from about 0.1% to about 2% for a duration in a range from about 15 seconds to about 5 minutes. In some embodiments, the roughness of surfaces of silicon recess regions 301 is in a range from about 2 Å to about 5 Å after cleaning.

After the cleaning process, the substrate is ready for formation of SiGe 250. With the formation of the reacted layer 307 and its removal afterwards, the thickness of the SiGe 250 formed is more even. In some embodiments, the thickness variation of SiGe 250 is equal to or less than about 30 Å, which is lower than about 40 Å for previous processes. In some other embodiments, the thickness variation of SiGe 250 is equal to or less than about 15 Å, which is also lower than about 40 Å for previous processes. Further, the variation of PMOS Idsat performance is improved to equal to or less than about 10%, which is less than about 15% for previous processes, in accordance with some embodiments. In some other embodiments, the variation of PMOS Idsat performance is improved to equal to or less than about 5%.

FIG. 4 shows a process flow 400 of forming epitaxial SiGe 250, in accordance with some embodiments. At operation 401, a recess is formed in a substrate. As described above, the substrate may already have gate and other structures formed. Operation 401 is similar to operation 108 described above. An exemplary recess formed in the substrate is the recess 203a shown in FIG. 2F. After the recess is formed, a surface treatment is performed at operation 403 to convert the surface of the recess into a reacted layer. The reacted layer may include silicon dioxide, silicon nitride, silicon oxynitride, silicon carbide, or other silicon-containing layer. The surface treatment may be an oxidation treatment, nitridation treatment, or oxynitridation treatment. The surface treatment may be a reactive process at high temperature, such as an RTP anneal process with a reactive gas (or gas mixture). For example, the RTP anneal may be at a temperature in a range from about 850° C. to about 1100° C. in an environment with an oxygen-containing gas (or gas mixture), a nitrogen-containing gas, a carbon-containing gas, or a combination thereof. The reactive gas (or gas mixture) may be mixed with an inert carrier gas, such as He, Ar, Ne, Xe, etc. After the surface treatment, a reacted surface layer is formed. The surface layer includes silicon and the reactive species.

As mentioned above, the surface layer may be silicon dioxide, silicon nitride, silicon oxynitride, silicon carbide, or other silicon-containing layer. Processes that can convert the post-etch silicon surface into a reacted compound may be used. In addition to the RTP process mentioned above, the process may be a microsecond anneal (μs anneal) that is conducted at a higher temperature, such as equal to or greater than about 1000° C., at a shorter period, such as about 50 μs to about 500 μs, to enable the reaction to occur. In some embodiments, the average thickness of the reacted layer is in a range from about 2 Å to about 500 Å. The reactive process may also be a plasma process, which is used to introduce reactive plasma ions to react with the silicon surface to form the reacted layer. Alternatively, the reactive process may be in-situ or ex-situ ashing process, which is an oxidizing plasma process. In addition, the reactive process may be a wet process that utilizes a reactive species, such as an oxidizing agent, to convert the silicon surface into the reacted layer. For example, a sulfuric acid ($H_2SO_4$) and hydrogen peroxide ($H_2O_2$) mixture (SPM) may be used.

After the reacted layer 307 is formed, the substrate is cleaned at operation 405 to remove the reacted layer 307. As mentioned above, the cleaning process may involve a diluted HF if the reacted layer 307 is made of silicon oxide. If the reacted layer 307 is made of other types of material, different cleaning chemistry could be used. For example, if the reacted layer 307 is made of SiN, a solution containing HF and/or $H_3PO_4$ could be used. Once the reacted layer 307 is removed, a process of forming a semiconductor material (or layer), such as SiGe, in the recess regions is performed at operation 407. After SiGe is formed in the recess regions, additional processing is performed to complete the formation of devices and interconnect. Further processing related to packaging may also be included to complete the manufacturing of the integrated circuits. As mentioned above, with the formation of the reacted layer on the etched silicon surface, the formation of SiGe in the recess regions is more uniform, which results in better device performance uniformity.

The embodiments of forming and removing a reacted layer on a surface of a recess described above provide mechanisms for improving thickness uniformity of a semiconductor material formed in the recess. The improved thickness uniformity in turn improves the uniformity of device performance.

In some embodiments, a method of forming an epitaxial semiconductor material in a recess of a substrate is provided. The method includes patterning the substrate, and etching the substrate to form the recess in the substrate. The method also includes performing a surface treatment to convert a surface of the recess into a reacted layer, and removing the reacted layer. The method further includes forming the epitaxial semiconductor material in the recess.

In some other embodiments, a method of reducing surface roughness of a recess of a substrate is provided. The method includes patterning the substrate, and etching the substrate to form the recess in the substrate. The method also includes performing a surface treatment to convert a surface of the recess into a reacted layer, and removing the reacted layer.

In yet some other embodiments, a method of forming an epitaxial semiconductor material in a recess of a substrate is provided. The method includes patterning the substrate, and etching the substrate to form the recess in the substrate. The method also includes performing a surface treatment to convert a surface of the recess into a reacted layer, and the reacted layer includes at least one of silicon oxide, silicon nitride, silicon oxynitride, and silicon carbide. The method further includes removing the reacted layer, and forming the epitaxial semiconductor material in the recess.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming an epitaxial semiconductor material in a recess of a substrate, comprising:
   patterning the substrate;
   etching the substrate to form the recess in the substrate;
   performing a surface treatment to convert a surface of the recess into a reacted layer, wherein the surface treatment is performed at a temperature equal to or greater than 925° C.;
   removing the reacted layer; and
   forming the epitaxial semiconductor material in the recess, wherein the epitaxial semiconductor material has a thickness variation less than about 30 angstroms.

2. The method of claim 1, wherein the substrate includes silicon.

3. The method of claim 1, wherein the reacted layer includes at least one of silicon oxide, silicon nitride, silicon oxynitride, or silicon carbide.

4. The method of claim 1, wherein the thickness of the reacted layer is in a range from about 2 Å to about 500 Å.

5. The method of claim 1, wherein the reacted layer is formed by a rapid thermal process utilizing a reactive gas.

6. The method of claim 1, wherein epitaxial semiconductor material includes silicon germanium (SiGe).

7. The method of claim 1, wherein the epitaxial semiconductor material has a thickness variation equal to or less than about 30 Å.

8. The method of claim 1, wherein the reacted layer is formed by at least one of a plasma treatment, or an ashing process.

9. The method of claim 1, wherein a portion of a sidewall of the recess has a tapered angle in a range from about 50° to about 70°.

10. The method of claim 1, wherein the sidewalls of the recess are substantially vertical.

11. The method of claim 1, wherein the recess is formed after a gate structure is formed and is formed next to the gate structure.

12. The method of claim 1, wherein the semiconductor material in the recess and the gate structure are part of a p-type metal-oxide-semiconductor (PMOS) field effect transistor.

13. A method of reducing surface roughness of a recess of a substrate, comprising:
   patterning the substrate;
   etching the substrate to form the recess in the substrate;
   performing a surface treatment at a temperature equal to or greater than about 1000° C. to convert a surface of the recess into a reacted layer, wherein a duration of the surface treatment ranges from about 50 microseconds (µs) to about 500 µs; and
   removing the reacted layer.

14. The method of claim 13, wherein the reacted layer includes at least one of silicon oxide, silicon nitride, silicon oxynitride, or silicon carbide.

15. The method of claim 13, wherein the surface roughness of the recess after the reacted layer is removed is in a range from 2 Å to about 5 Å.

16. The method of claim 13, the reacted layer is formed by at least one of a thermal process, a plasma treatment, or an ashing process.

17. The method of claim 13, wherein the recess is formed after a gate structure is formed and is formed next to the gate structure.

18. The method of claim 13, wherein the thickness of the reacted layer is in a range from about 2 Å to about 500 Å.

19. The method of claim 13, wherein a portion of a sidewall of the recess has a tapered angle in a range from about 50° to about 70°.

20. A method of forming an epitaxial semiconductor material in a recess of a substrate, comprising:
   patterning the substrate;
   etching the substrate to form the recess in the substrate;
   performing a surface treatment to convert a surface of the recess into a reacted layer having a non-uniform thickness, wherein the reacted layer includes at least one of silicon oxide, silicon nitride, silicon oxynitride, or silicon carbide, and the surface treatment is performed at a temperature equal to or greater than 925° C.;
   removing the reacted layer; and
   forming the epitaxial semiconductor material in the recess, wherein the epitaxial semiconductor material has a thickness variation less than about 30 angstroms.

* * * * *